United States Patent [19]
Kadyk et al.

[11] Patent Number: 5,930,399
[45] Date of Patent: Jul. 27, 1999

[54] DATA ENCODING FOR A COMMUNICATION CHANNEL SUPPORTING A SUBSET OF THE CHARACTERS TO BE TRANSMITTED

[75] Inventors: Donald J. Kadyk, Bothell; Vinay Deo, Bellevue; Joan R. Anastasio, Redmond, all of Wash.

[73] Assignee: Microsoft Corporation, Redmond, Wash.

[21] Appl. No.: 08/826,541

[22] Filed: Apr. 3, 1997

Related U.S. Application Data

[63] Continuation-in-part of application No. 60/025,748, Sep. 19, 1996.

[51] Int. Cl.[6] .................................................. G06K 9/36
[52] U.S. Cl. .................... 382/245; 382/232; 382/233; 382/235; 340/311.1; 340/313; 340/425.1; 341/55; 341/87; 341/95; 341/106; 341/107
[58] Field of Search .................................. 382/245, 232, 382/233, 235, 244, 246, 310; 340/311.1, 313, 425.1; 341/55, 87, 95, 106, 107

[56] References Cited

U.S. PATENT DOCUMENTS

| | | | |
|---|---|---|---|
| 4,626,829 | 12/1986 | Hauck | 340/347 |
| 4,752,765 | 6/1988 | Larson | 340/347 |
| 4,862,167 | 8/1989 | Copeland, III | 341/107 |
| 5,357,546 | 10/1994 | Meriwether et al. | 375/122 |
| 5,389,922 | 2/1995 | Seroussi et al. | 341/51 |
| 5,550,540 | 8/1996 | Furlan et al. | 341/51 |
| 5,663,721 | 9/1997 | Rossi | 341/51 |
| 5,703,907 | 12/1997 | James | 375/240 |

*Primary Examiner*—Leo H. Boudreau
*Assistant Examiner*—Kanji Patel
*Attorney, Agent, or Firm*—Ronald M. Anderson

[57] ABSTRACT

Characters that are not among those recognized for use in page messages are encoded using a subset of the recognized printable characters to enable the data comprising a page object to be transmitted over a paging channel. In one preferred form of the invention, a subset of the recognized printable characters are designated as encoding characters for use in encoding data that includes characters not among the recognized printable character set. Further, each time that one of the encoding characters occurs in the input data, the byte representing that character must also be encoded. To encode the characters, the byte is divided into nibbles. Each nibble is a hexadecimal digit that is encoded using one of the 16 encoding characters. If a byte of the input data repeats more than four times in succession, it is run length encoded (RLE) during the encoding process to compress the encoded data. Upon receipt, the encoded data are decoded using the same encoding characters, to recover the nibbles of each byte of the original input data. Furthermore, run length decoding is applied when a run length encoding signal character occurs in the encoded data stream. The run length encoding signal character is selected from the recognized printable character set. Using this technique, data can be sent that include characters not within the recognized printable character set and the encoded characters can be compressed to substantially reduce the amount of data transmitted as a paging object if the input data includes significant repeating characters.

26 Claims, 6 Drawing Sheets

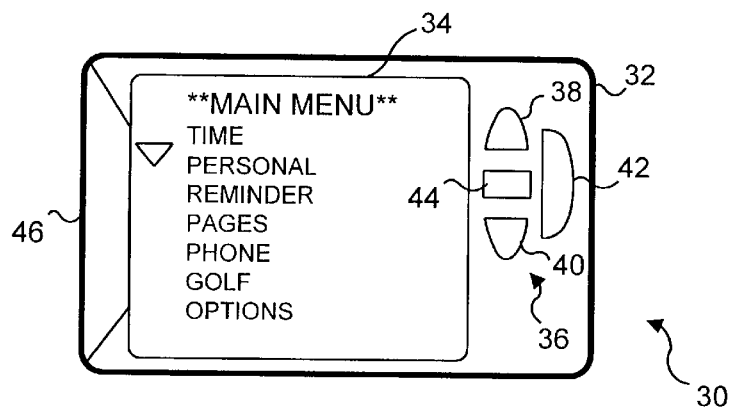
FIG. 1
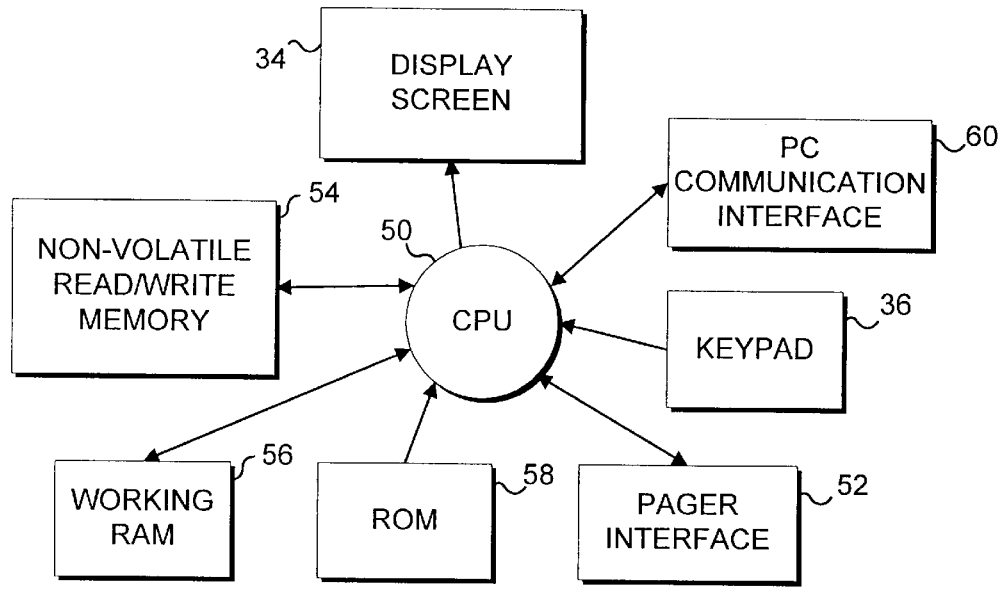
FIG. 2
| FULL ASCII CHARACTER SET (00H - FFH) | | | | | |
|---|---|---|---|---|---|
| RANGE A CHARACTERS THAT MUST BE ENCODED (00H - 1FH) | RECOGNIZED ASCII CHARACTERS (20H - 7EH) | | | | RANGE C CHARACTERS THAT MUST BE ENCODED (7EH - FFH) |
| | ENCODING NOT REQ'D. (20H - 2FH) | RANGE B ENCODING CHARACTERS - MUST BE ENCODED - (30H - 3FH) | ENCODING NOT REQ'D. (40H - 7DH) | RLE SIGNAL CHARACTER - MUST BE ENCODED - (7EH) | |
FIG. 3

| ENCODING EXAMPLE ||| 
|---|---|---|
| INPUT DATA: 12H, 20H, 22H, 35H ... (REPEATED 100 TIMES), 45H, 7E, 7F (106 BYTES) |||
| CURRENT BYTE | OUTPUT BYTE(S) | ENCODING STEP(S) |
| 12H | 31H, 32H | FIG. 4 BLOCKS 90 & 94 |
| 20H | 20H | FIG. 4 BLOCKS 90 & 92 |
| 22H | 22H | FIG. 4 BLOCKS 90 & 92 |
| 35H (REPEATED) | 7EH | FIG. 4 BLOCK 88, FIG. 5 BLOCK 112 |
|  | 32H | FIG. 5 BLOCK 114 |
|  | 36H, 34H | FIG. 5 BLOCK 116 |
|  | 33H, 35H | FIG. 4 BLOCKS 90 & 94 |
| 45H | 45H | FIG. 4 BLOCKS 90 & 92 |
| 7EH | 37H, 3EH | FIG. 4 BLOCKS 90 & 94 |
| 7FH | 37H, 3FH | FIG. 4 BLOCKS 90 & 94 |
| OUTPUT DATA: 31H, 32H, 20H, 22H, 7EH, 32H, 36H, 34H, 33H, 35H, 45H, 37H, 3EH, 37H, 3FH (15 BYTES OF COMPRESSED DATA) |||

*FIG. 8*

| DECODING EXAMPLE |||
|---|---|---|
| INPUT DATA: 31H, 32H, 20H, 22H, 7EH, 32H, 36H, 34H, 35H, 45H, 37H, 45H, 37H, 3EH, 37H, 3FH (15 BYTES OF COMPRESSED DATA |||
| CURRENT BYTE | OUTPUT BYTE(S) | DECODING STEP(S) |
| 31H, 32H | 12H | FIG. 6 BLOCKS 134 - 142 |
| 20H | 20H | FIG. 6 BLOCK 146 |
| 22H | 22H | FIG. 6 BLOCK 146 |
| 7EH | - | FIG. 7 BLOCK 162 |
| 32H | (NUMNIBBLESINLENGTH) | FIG. 7 BLOCK 166 (2 NIBBLES) |
| 36H, 34H | (REPEATCOUNT) | FIG. 7 BLOCKS 168, 170, 172, & 174 |
| 33H, 35H | 35H (100 TIMES) | FIG. 7 BLOCK 176 |
| 45H | 45H | FIG. 6 BLOCK 146 |
| 37H, 3EH | 7EH | FIG. 6 BLOCKS 134 - 142 |
| 37H, 3FH | 7FH | FIG. 6 BLOCKS 134 - 142 |
| OUTPUT DATA: 12H, 20H, 22H, 35H ... (REPEATED 100 TIMES), 45H, 7E, 7F |||

DATA ENCODING FOR A COMMUNICATION CHANNEL SUPPORTING A SUBSET OF THE CHARACTERS TO BE TRANSMITTED

RELATED APPLICATION

This application is a continuation-in-part of prior pending provisional patent application Ser. No. 60/025,748, filed Sep. 19, 1996, the benefit of the filing date of which is hereby claimed under 35 U.S.C. § 119(e).

FIELD OF THE INVENTION

The present invention generally pertains to a method and system for communicating over a channel using a limited data set, and more specifically, to communicating using a subset of characters comprising the data to encode the data.

BACKGROUND OF THE INVENTION

Certain types of communication channels are generally restricted in the amount of data that are included in each transmission and in the characters that can be transmitted. If the message is short and limited to the characters that can be transmitted over the channel, the limitations do not present a problem. For example, the accepted protocol for paging channels used to transmit signals to portable paging devices limits the amount of data in each transmission to 240 characters. In addition, only printable American National Standard Code for Information Interchange (ASCII) characters can be transmitted over a paging channel. Since conventional pagers typically have displays on which only a few lines of an alphanumeric message comprising only the printable characters can be displayed, this limitation has not previously posed much of a problem. However, new applications for paging and other portable electronic communication devices are being developed that will greatly expand the amount and type of data, which will be transmitted over paging and other communication channels, and as a consequence, such limitations have become a problem.

The problem is most evident in cases where data not limited to printable ASCII characters must be transmitted over a paging channel or other similarly limited communication channel. Such data may include any of the 256 characters in the expanded ASCII character set typically used in many fonts. The data will be transmitted to a new type of page receiver that includes a microprocessor with a limited memory. In addition to receiving conventional paging messages, the pager also serves as a personal information management (PIM) device. The microprocessor in the pager can execute small software applications called "applets." The data transmitted to this new pager thus often include ASCII characters that are not within the limited printable ASCII character set specified for transmission over paging channels.

One solution to this problem would be to encode the entire data to be transmitted using only the printable ASCII characters that are allowed to be transmitted over the pager communication channel. Such an approach would thus be similar to that used in the UUEncoding of binary files into E-mail messages for transmission over the Internet. However, the technique will often produce an encoded data file that is substantially larger than the original data file, and the encoded file size that is thus produced can easily exceed the 240 characters per transmission limit set by the paging industry. Accordingly, it will be evident that a modified approach must be employed to encode full range of ASCII characters in the data that must be transmitted to the new pager using only the limited printable ASCII characters, so that the resulting encoded data transmitted are compact and the encoded data are less than the limit imposed by the paging channel specification. Furthermore, the method must impose a relatively minimal processing load on the microprocessor included in the pager, so that its efficiency in handling all of the other functions it provides is not adversely affected.

SUMMARY OF THE INVENTION

In accord with the present invention, a method is defined for encoding data comprising any character included in a set of characters, for transmission over a communication channel in which only a subset of the characters is permitted to be transmitted. Each character in the set of characters is represented by a hexadecimal value (i.e., a byte). The method includes the step of obtaining two nibbles that comprise the hexadecimal value representing a character in the data to be transmitted, where each nibble is a single hexadecimal digit. A plurality of encoding characters from the subset of characters permitted to be transmitted is selected, and each of the plurality of encoding characters is assigned to encode a different hexadecimal digit. Encoded data are then produced by replacing the two nibbles of the hexadecimal value representing a character in the data to be transmitted with bytes representing the encoding characters assigned to the respective hexadecimal digits comprising the two nibbles if the character in the data is not in the subset of characters, or is one of the encoding characters. Otherwise, the byte representing the character from the data is included in the encoded data directly, without being encoded.

The encoding characters preferably comprise 16 contiguous characters. Alternatively, the encoding characters can comprise 16 characters that are selected from the subset of characters as a function of a statistical attribute of the selected characters. For example, the statistical attribute can comprise a frequency of use of the characters in data transmitted over the communication channel, so that the characters selected for use as the encoding characters are less likely to appear in the data to be transmitted.

The method further preferably includes the step of compressing the data to be transmitted to produce compressed encoded data. Run length encoding is used for compressing the data and includes the step of determining a number of times that any character in the data to be transmitted is successively repeated. One of the characters from the subset of characters is selected as a compressed block signal indicator character to indicate where each block of the compressed data occurs within the encoded data. The compressed block signal indicator character is also encoded by replacing the nibbles comprising its hexadecimal value with the encoding characters assigned to encode those nibbles.

A lookup table is preferably used to encode the data to be transmitted. The lookup table includes 16 hexadecimal digits and the encoding character assigned to each of the hexadecimal digits.

Another aspect of the present invention is directed to a method for decoding the encoded data. Other aspects of the invention are directed to a system for encoding data, and a system for decoding data. Each system includes a processor that implements machine instructions stored in memory to effect functions that are generally consistent with the steps discussed above.

BRIEF DESCRIPTION OF THE DRAWING FIGURES

The foregoing aspects and many of the attendant advantages of this invention will become more readily appreciated as the same becomes better understood by reference to the following detailed description, when taken in conjunction with the accompanying drawings, wherein:

FIG. 1 is a plan view of a portable pager referred to as "Nomad" that is used for receiving and decoding encoded data transmissions in accord with the present invention;

FIG. 2 is a block diagram illustrating the functional components of the Nomad pager shown in FIG. 1;

FIG. 3 is a table that identifies the ASCII characters that are recognized in paging transmissions and those that are not recognized and are encoded for transmission to the pager;

FIG. 7 is a flow chart of the steps used for run length decoding the transmissions received by the pager;

FIG. 8 is a table of exemplary input data and encoded output data, indicating the steps of the flowcharts in FIGS. 5 and 6 that are implemented when encoding input data;

FIG. 9 is a table of exemplary encoded input data and decoded output data, indicating the steps of the flowcharts in FIGS. 7 and 8 that are implemented to decode the encoded data.

DESCRIPTION OF THE PREFERRED EMBODIMENT

Figure 4:
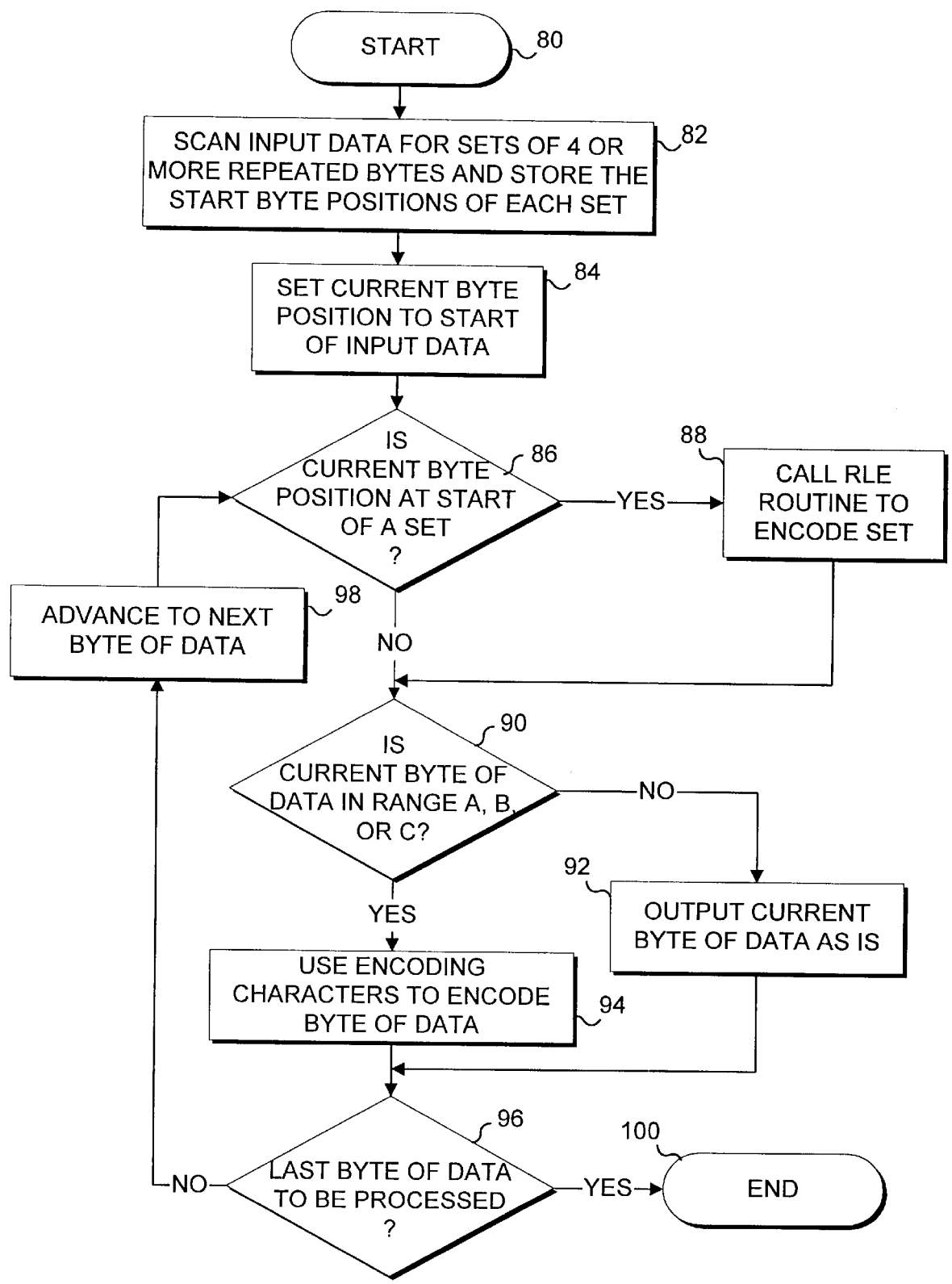
FIG. 4 is a flow chart illustrating the logic employed in encoding data to be transmitted to the pager.

A preferred form of the present invention is embodied in a combination pager and data management device referred to herein as Nomad. However, it is contemplated that the present invention can also be used in connection with other readily portable electronic devices to create enhanced utility for such devices that will encourage users of the devices to carry them at all times. For example, a combination cellular phone and PIM device is contemplated as an alternative. Accordingly, it is not intended that the invention be limited by the disclosure of the present preferred form of the invention in connection with a paging device.

The User Interface

A top view of a Nomad pager and data management device 30 is shown in FIG. 1. The user interface for the device includes four buttons in a keypad 36 that are used to control the display and the actions performed by Nomad in connection with its conventional paging and data management functions. Nomad includes a housing 32 in which keypad 36 is disposed. The keypad includes an Action button 42, a Back button 44, an Up button 38, and a Down button 40. These buttons navigate the user through a directory hierarchy like that shown on a display screen 34 in FIG. 1. The Action/Back buttons are paired as opposites, and their functionality is similar to the Enter and Escape keys on a conventional QWERTY keyboard. The Action button takes the user in (to a selected lower level) and the Back button takes the user out (to a next higher [or parent] level). The Up/Down buttons are another functional pair of buttons that move the user up and down within display 34. Display 34 is preferably a liquid crystal display (LCD), which in the preferred embodiment, includes eight lines, with 17 characters per line. Other types and sizes of displays can alternatively be used in connection with the present invention for displaying alphanumeric characters and/or graphic icons.

Referring now to FIG. 2, a functional block diagram illustrates the components comprising Nomad. An eight-bit central processing unit (CPU) 50 implements the software controlled functions performed by Nomad, including decoding encoded data received by Nomad, in accordance with the present invention. CPU 50 is coupled to display 34 so that text characters and graphic icons generated in response to software instructions executed by the CPU appear on the display. Data that are downloaded or entered by the user into Nomad are stored in a non-volatile read/write memory 54, and this memory is bidirectionally coupled to the CPU, which reads and writes the data in a serial stream. The capacity of the non-volatile memory is about eight Kbytes in the preferred embodiment. A random access memory (RAM) 56, having a capacity of about four Kbytes in the preferred embodiment, is also coupled bidirectionally to the CPU, and provides volatile storage for machine instructions that are executed by the CPU and storage for temporary data such as register values. Default values for configuration options and other variables are stored in a read only memory (ROM) 58, which has a capacity of about 40 Kbytes in the preferred embodiment. ROM 58 is also used to store the operating code (machine instructions) controlling the basic functionality of Nomad, e.g., its operation when receiving conventional paging messages.

Paging signals received as radio frequency (RF) transmissions are handled through a pager interface 52, which is coupled to CPU 50. While not required, it is contemplated that the paging communication link can be bidirectional. As already noted, keypad 36 provides a simple user interface to permit control of the device, editing, and other user determined selections to be entered with only four buttons. Since the data stored in non-volatile memory 54 are likely to be more extensive than a user would care to enter using only the four buttons, such data are most efficiently entered through a PC communication interface 60. Preferably, this interface comprises an infrared (IR) sensor/transmitter 46 (shown in FIG. 1), which communicates through an IR data port of a personal computer (PC), which is not shown. The data are downloaded from the PC to Nomad through the PC communication interface or alternatively, data can be uploaded from Nomad to the PC through this IR interface.

Screen Layout

In its preferred form, Nomad's display 34 is employed to display bitmapped characters in eight rows by 17 columns, allowing a substantial amount of information to be viewed by the user at one time. Although not shown in FIG. 1, above the display area are a row of icons, and on the left hand side of the display area may be one or two auxiliary icons resembling up and down arrows. The up icon indicates hidden lines above the currently visible text, and the down icon indicates hidden lines below the currently visible text.

Navigation and Menu Support

Navigation on Nomad is done with hierarchical menus, enabling the user to move through a tree structure. FIG. 1 illustrates the Main Menu on display 34. The first line of every menu is its title (i.e., " MAIN MENU " in this case). The title of the menu is in upper case font characters and is set off with asterisks to visually distinguish it from the items in the menu. The title is optional—the software (executed on the PC) used to load the data into Nomad can be set to selectively include a title in the menu.

To navigate through the display, the user moves a selection line (which appears in reverse video on the display) up or down to select a desired list item. When the selection line is at the bottom and the down icon is showing, the next Down button push scrolls the list up one line, keeping the selection line at the bottom. When the selection line is the last list item, the down icon turns off and additional Down button pushes do nothing. An analogous process applies to the Up button and up icon arrow. The title line is never selectable, but it scrolls off the screen as if it were just another list item when the user scrolls to lines below the initially displayed screen.

Referring to FIG. 3, a table 70 illustrates how a full ASCII character set that includes characters represented by bytes 00H through FFH are divided into different groups relating to the present invention. As is conventional, bytes that are in hexadecimal notation are identified by a capital "H" following the two nibbles comprising each byte. As noted above, the paging channel specification requires that the characters in a paging message be a printable subset comprising characters 20H through 7EH, of the full ASCII character set comprising characters 00H through FFH. Thus, any page object that is transmitted over a conventional paging radio network must conform to this specification. Page objects that include ASCII characters outside the range of recognized printable ASCII characters cannot normally be sent over a conventional paging channel. The present invention overcomes this restriction by encoding the "non-printable" characters using selected encoding characters from the subset of recognized printable ASCII characters.

The present invention divides the full ASCII character set, 00H through FFH, into a plurality of sets. These sets include a range A comprising characters that must be encoded using the recognized printable ASCII character set and including ASCII characters represented by bytes 00H through 1FH. The next group of characters for which encoding is not required because they are among the recognized printable ASCII characters are represented by bytes 20H through 2FH. A range B includes the encoding characters represented by bytes 30H through 3FH used for encoding ASCII characters that are not within the recognized printable ASCII character range. It should be noted that although range B falls within the recognized printable ASCII character set, any of the characters in the data to be transmitted that are within range B must also be encoded. The next set of characters represented by bytes 40H through 7DH are those for which encoding is not required. Finally, a range C includes characters represented by bytes 7EH through FFH that also must be encoded. It should be noted that the initial character in range C (i.e., the ~ character), represented by byte 7EH, is the last character of the recognized printable ASCII characters and would ordinarily not be encoded. However, the character represented by byte 7EH is designated in the preferred embodiment as a run length encoding (RLE) signal character. For this reason, the character represented by byte 7EH must also be encoded and is therefore included within range C.

In table 70, range B is designated for use in encoding: (a) characters that are outside the recognized printable ASCII character set; (b) characters falling within range B; and (c) the RLE signal character. In this embodiment, range B includes 16 contiguous characters from the recognized printable ASCII character set. Alternatively, it may be preferable to use 16 encoding characters that are specifically selected from among the recognized printable ASCII characters on a statistical basis, e.g., the 16 characters that are used least frequently in page objects transmitted to Nomad. Since any encoding characters of range B that appear in the data to be encoded must also be encoded using the encoding characters, the overall length of encoded paging objects can be reduced by minimizing the occurrence of the encoding characters in the input data that is to be transmitted to Nomad. Thus, by selecting the characters included in range B from those that are statistically least frequently found within the data to be transmitted, it should be possible to reduce the length of the page object data, since it would be less likely that the encoding characters would be used to encode themselves in the encoded data. To select the appropriate encoding characters for range B in this alternative embodiment, it should only be necessary to run a statistical analysis of the characters used in a number of page objects and then to select the 16 least frequently used characters among the recognized ASCII characters 20H through 7EH for use as the encoding characters comprising range B. Furthermore, although the first embodiment designated the ~ character 7EH for use as the RLE signal character, it should be apparent that another relatively infrequently used character among the recognized ASCII characters could alternatively be used for that purpose and therefore included in range C. Further, the present invention does not require that run length encoding be applied to compress the data messages, although it is clearly preferable to minimize the number of characters transmitted in a page object to achieve the message length limit established by page channel specifications. If run length encoding is not required, the RLE signal character is not used, and would not be included in range C. Once the specific characters comprising range B are determined, a lookup table can be used to identify the hexadecimal encoding character that represents each of the nibbles comprising a byte of the data to be encoded. The lookup table will associate each of the 16 possible nibbles with a different one of the encoding characters comprising range B.

Referring now to FIG. 4, the flow chart contained therein illustrates the logic implemented to encode characters contained in data that are to be transmitted to Nomad, where the characters may include those that are not within the recognized printable ASCII character set, 20H through 7EH. From a start block 80, the logic proceeds to a block 82 in which the input data are scanned to identify sets of four or more repeated bytes. The purpose of scanning the data is to determine sets of repeating bytes that are appropriately run length encoded, to compress the encoded data transmitted to Nomad. This step also provides for storing the start byte positions of each set of four or more repeated bytes found in the data to be transmitted. The encoding operation will typically be performed on a conventional personal computer having substantially greater computational and memory resources than are available on Nomad. Given the resources that are available on a personal computer, it is possible to use more sophisticated algorithms for encoding and compressing the data than would be practical in the limited processing environment provided Nomad. Accordingly, it will be apparent the decoding procedure and run length decoding of encoded data that are received must be relatively simple in order to be executed by Nomad.

In a block 84, the current byte position is set to the start of the input data to begin the encoding and compression process. A decision block 86 determines if the current byte position is at the start of one of the sets of repeating four or more characters. If the response is affirmative, a block 88 provides for calling the RLE routine used to run length encode the set of repeating characters in order to compress the data that are to be transmitted to Nomad. The details implemented in block 88 are described below. Thereafter, or if the current byte position is not at the start of a set of four or more repeating characters, the logic proceeds to a decision block 90, which determines if the current byte of data is in any of ranges A, B, or C. With reference to FIG. 3, it will be recalled that range A includes the characters represented by bytes 00H–1FH, which must be encoded. Range B includes the encoding characters (represented by bytes 30H through 3FH), which must themselves be encoded, and range C includes characters represented by bytes 7EH through FFH that must be encoded. If the current byte is not within one of three ranges, it represents one of the characters for which encoding is not required, i.e., a character represented by one of the bytes in the range 20H through 2FH and 40H through 7DH. Since such characters do not require encoding, a block 92 provides for outputting the current byte of data as is, without encoding. Conversely, if the current byte of data falls within any of ranges A, B, or C, encoding is required.

A block 94 provides for using the encoding characters in range B to encode the current byte of data. This step is relatively simple, since each byte of data comprises two nibbles, each nibble being a hexadecimal digit that is encoded using the corresponding encoding character from range B. For example, the byte 1BH includes the nibbles "1" and "B." Nibble "1" is encoded by replacing it with encoding character 31H, and nibble "B" is encoded by replacing it with encoding character 3BH. (The above example and other similar examples set forth below assumes that the encoding characters in range B are the 16 consecutive characters indicated in Table 70 of FIG. 3.) A decision block 96 then determines if the last byte of the input data has been processed and if not, a block 98 advances to the next byte of data. After the next byte of data has been loaded, the logic returns to decision block 86 to determine if the then current byte position is at the start of a set of repeating characters. Once all bytes of the input data have been processed, the logic proceeds to a block 100, wherein the program for encoding the data terminates.

Figure 5:
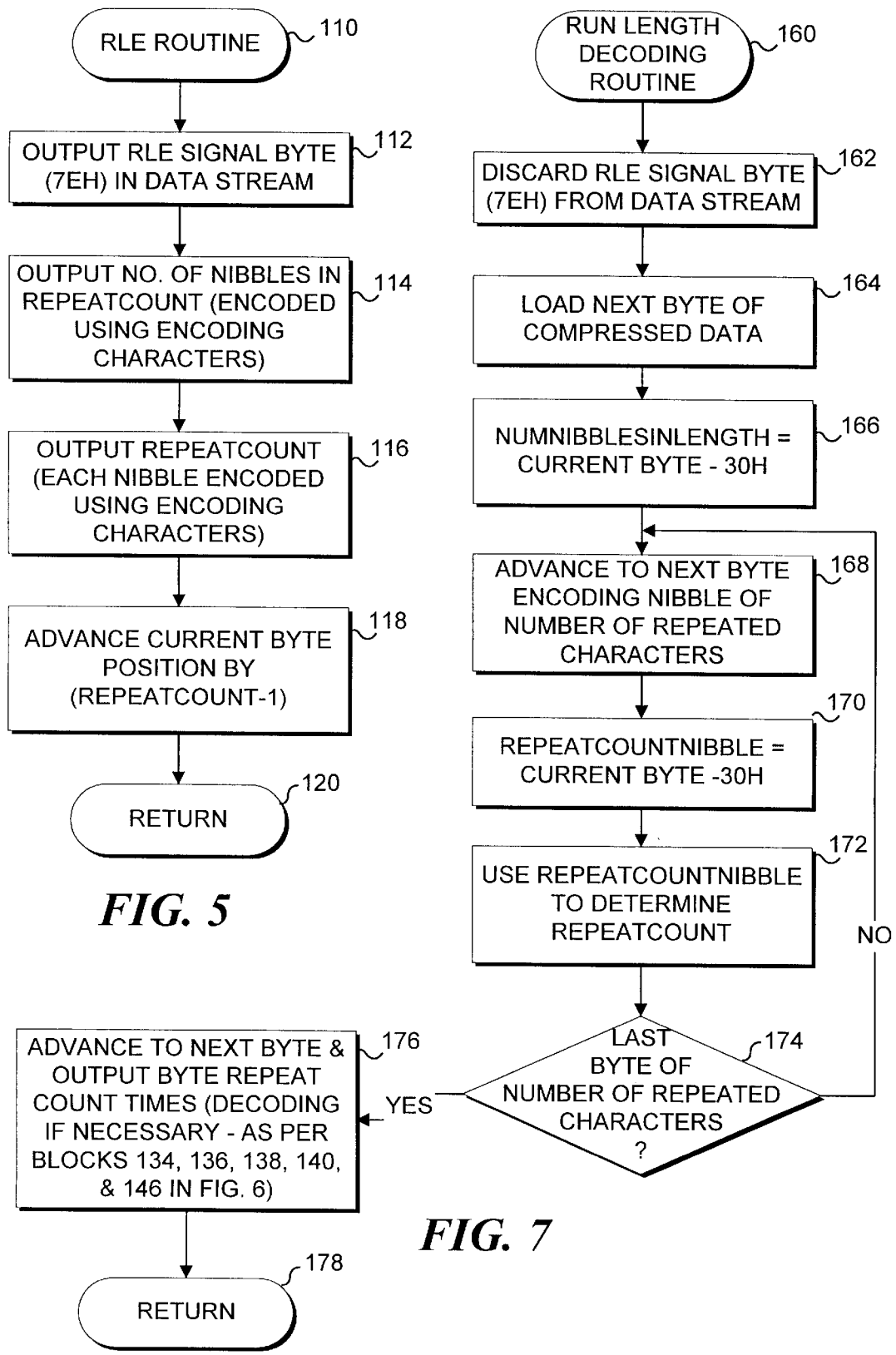
FIG. 5 is a flow chart showing the steps for run length encoding the data to be transmitted to the pager.

Details of the RLE routine called in block 88 of FIG. 4 are illustrated in FIG. 5. From a block 110, the logic proceeds to a block 112, which provides for output of the RLE signal byte (7EH) in the output data stream. The RLE signal byte is used to indicate when RLE characters appear in the output data. It should be noted that if the byte 7EH otherwise occurs in the input data to be transmitted, it will be encoded by dividing it into nibbles "7" and "E," which are respectively represented by the encoding bytes 37H and 3EH.

A block 114 provides for output of the number of nibbles in a variable called "RepeatCount." This variable identifies the number of times (in hexadecimal notation) that a character in the input data is repeated. Since the hexadecimal number indicating the variable RepeatCount falls within the encoding characters of range B, it must also be encoded using the encoding characters (i.e., the encoding bytes representing the characters in range B). For example, if a character is repeated 25 (19H) times in the input data stream, the RepeatCount 19H would be encoded using encoding character bytes 31H and 39H in the output data stream.

A block 118 then advances the current byte position by the value RepeatCount—1 so that the new current byte position is set to the last byte of the repeating characters in the current set. A block 120 then provides for returning to the encoding program to continue with the logic implemented starting with decision block 90. The last byte of the repeating set of bytes is thus encoded if it is within any of ranges A, B, or C, and if not, is output as is.

Figure 6:
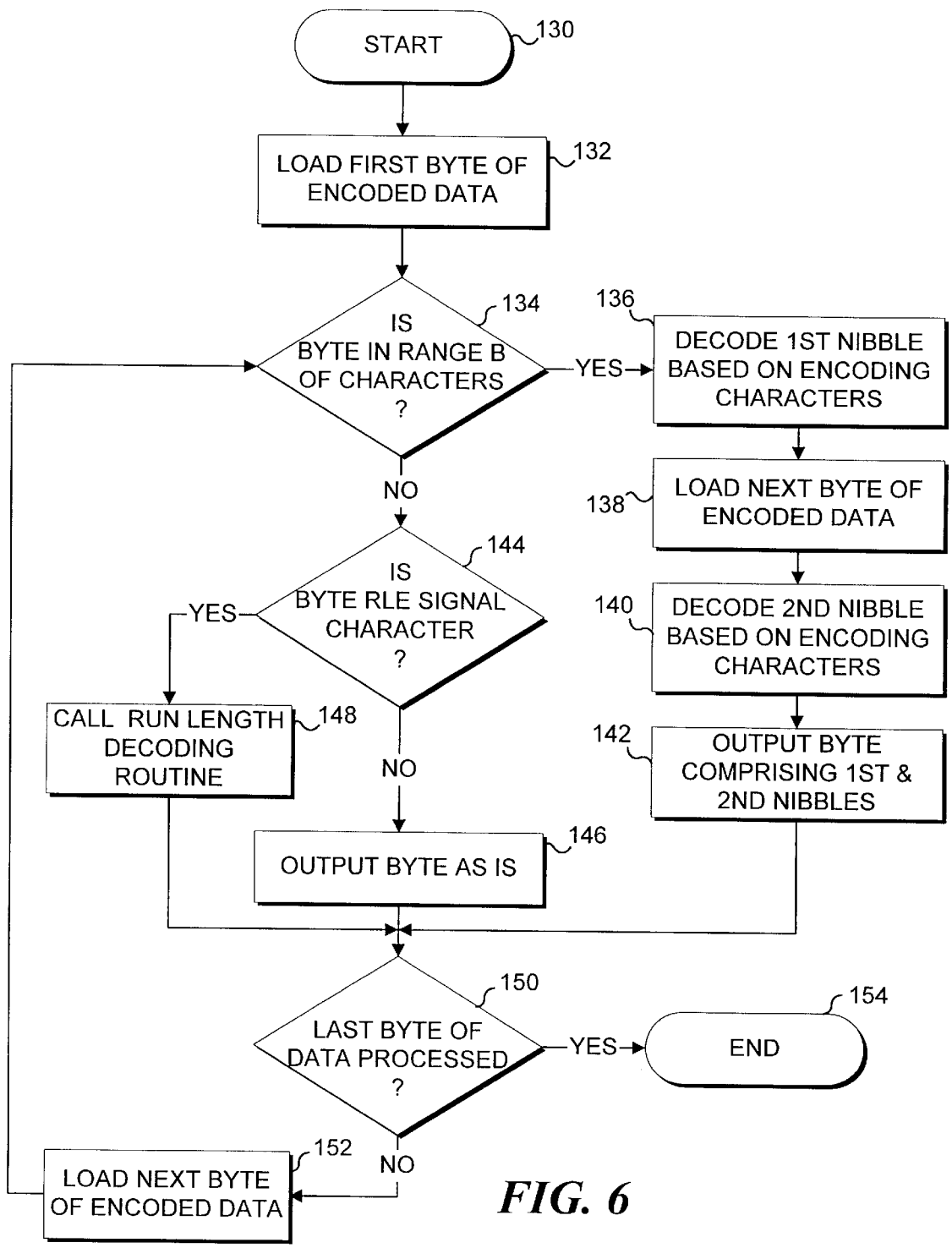
FIG. 6 is a flow chart of the logic used for decoding the transmissions received by the pager.

Encoded data that are received by Nomad must be processed to decode the data and to expand compressed data that have been run length encoded. The logic required to decode encoded data is illustrated in FIG. 6. From a start block 130, the logic proceeds to a block 132, which provides for loading the first byte of encoded data to be processed. A decision block 134 determines if the byte is within range B. If so, a block 136 provides for decoding the first nibble of the byte that will be output as decoded based upon the encoding characters that were used to encode it. For example, if the current byte of encoded characters is 36H, the first nibble of the output decoded character will be a 6. A block 138 then loads the next byte of encoded data. In a block 140, the second nibble of the output decoded character is decoded, again using the encoding character bytes. For example, if the current encoded byte is 32H, the second nibble of the output decoded character is a 2. Finally, a block 142 outputs the decoded byte, which is the combined first and second nibbles just determined. For the example noted above, the output decoded byte is 62H. The logic then proceeds to a decision block 150.

Returning to decision block 134, if the byte then being processed is not within range B of the characters, the logic proceeds to a decision block 144, which determines if the byte represents the RLE signal character (i.e., byte 7EH). If not, the byte is output to the decoded data stream as is, without further modification, as indicated in a block 146. However, if the byte represents the RLE signal character, a block 148 calls the run length decoding routine to recover the compressed data that was previously run length encoded. Details of the run length decoding routine in block 148 are discussed below. The logic then proceeds to decision block 150. Following either blocks 142, 146, or 148, decision block 150 determines if the last byte of data has been processed and if not, a block 152 provides for loading the next byte of encoded data for processing. The logic then returns to decision block 134. However, once the last byte of data is processed, the decoding program concludes in a block 154.

FIG. 7 illustrates details of the run length decoding routine as indicated in a block 160. The routine provides for discarding the RLE signal byte (7EH) from the output decoded data stream, since its only purpose is to indicate that RLE data follow in the encoded data stream. A block 164 loads the next byte of compressed data from the encoded data that was received by Nomad. A block 166 sets a variable "NumNibblesInLength" equal to the current byte minus 30H. This step is carried out to determine the number of nibbles that were used to specify the variable RepeatCount. It will be recalled that during the run length encoding process, the variable RepeatCount specifying the number of repeated bytes was encoded using the encoding characters. Furthermore, the number of nibbles used for the RepeatCount was included immediately following the RLE signal byte. Block 166 thus recovers a number indicating the number of nibbles that were used for the repeat count. Since 30H through 39H represent the numbers 0 through 9, by subtracting 30H from the current byte, the decimal value for the variable NumNibblesInLength is recovered.

A block 168 advances to the next byte that is used for encoding the nibble of the number of repeated characters. In the example given above, the repeat count was 19H (25), which includes two nibbles, so that the current byte that was used to indicate that the number of nibbles for the RepeatCount in this example equals 32H. In block 168, the next byte of encoded data corresponds to the first nibble of the number of repeated characters. In the example, the next byte would be 31H, which is decoded to recover the nibble "1," as indicated in a block 170 wherein the RepeatCount nibble is equal to the current byte minus 30H. A block 172 then assigns the nibble to the appropriate position in the RepeatCount. In the previous example, since only two nibbles are used to indicate the repeat count, the first nibble would be the most significant and would be assigned to that position in determining the RepeatCount in block 172. A decision block 174 then determines if the last byte of the number of repeated characters has been processed, and if not, returns to block 168, which advances to the next byte used for encoding the next nibble used for specifying the RepeatCount. This byte would be equal to "39H" in the above example. The nibble 9 is recovered in block 170 by subtracting 30H from 39H, and in block 172, the nibble 9 is assigned to the least significant position of the repeat count. Decision block 174 then determines that all bytes indicating the number of repeated characters have been processed, based on the NumNibblesInLength value determined in block 166. The logic then proceeds to a block 176, which advances to the next byte and outputs the byte the number of times indicated by the RepeatCount. In this step, the next byte is decoded as necessary, in accordance with blocks 134, 136, 138, 140, and 146 shown in FIG. 6. Thus, the decoded byte in the example provided above would be repeated 19H (25) times in the output data stream. A block 178 then causes the program to return to the decoding program shown in FIG. 6 at decision block 150.

An example of input data encoding and decoding should help to more clearly illustrate how the present invention is used for encoding and decoding data, including input data with repeated characters that are compressed using the RLE technique. FIG. 8 illustrates an encoding example, specifying both the bytes that are input for encoding and the output encoded bytes, and indicates the encoding steps from FIGS. 4 and 5 that are used in the process. The input data include 106 bytes consisting of the bytes: 12H, 20H, 22H, 35H . . . (repeated 100 times), 45H, 7E, and 7F. As indicated in the steps shown in a Table 190 of FIG. 8, the first input byte, 12H, is within range A and must be encoded using the encoding bytes of range B. This first input byte consists of the nibbles "1" and "2." The two nibbles are encoded using encoding bytes 31H and 32H, which thus appear in the output encoded data stream. Blocks 90 and 94 in FIG. 4 are used to first determine that the input data byte needs to be encoded and then carry out the encoding step. In contrast, the next two bytes of input data are within the range of recognized printable ASCII characters but are not in the encoding characters within range B. Consequently, these bytes are output in the encoded data stream without change, as provided by blocks 90 and 92 in FIG. 4.

The next byte in the input data is repeated 100 (64H) times. Accordingly, these 100 repeated bytes can be run length encoded to substantially compress the encoded data. Since the encoding program determines that more than four repeated characters exist in the input data, the process produces an output byte corresponding to the RLE signal character (7EH) to indicate that repeating character data follows. These steps are consistent with FIG. 4, block 88 and FIG. 5, block 112. Since the RepeatCount, 64H, has two nibbles "6" and "4," the next output byte is 32H, corresponding to a value for NumNibblesInLength equal to 2. This step is consistent with that shown in FIG. 5, block 114. Next, the RepeatCount, 64H, is encoded, producing output bytes 36H and 34H in the output encoded data stream, consistent with FIG. 5, block 116. The actual character that is repeated, 35H, is then encoded, producing output encoded bytes 33H and 35H, consistent with FIG. 4, blocks 90 and 94.

The next input data byte, 45H, is output without change, since it falls within the range of recognized printable characters that are not used for encoding. The following byte in the input data, 7EH, must also be encoded, since it is the RLE signal character and appears in the input data for a purpose other than indicating that repeating character data follows. The two nibbles "7" and "E" comprising this byte are encoded, producing output bytes 37H and 3EH. Again, these steps are consistent with blocks 90 and 94 in FIG. 4. Finally, the last byte, 7FH, which is also among the data in range C that must be encoded, is divided into its two nibbles 7 and F. These nibbles are then encoded, producing output encoded bytes 37H and 3FH. The resulting output data stream consists of the 15 bytes: 31H, 32H, 20H, 22H, 7EH, 32H, 36H, 34H, 33H, 35H, 45H, 37H, 3EH, 37H, and 3FH. It will thus be apparent that 106 bytes of input data have been encoded using recognized printable ASCII characters and run length encoded, producing only 15 bytes of compressed data in a paging object that will be transmitted to Nomad.

In FIG. 9, the encoded and compressed data produced in the example shown in Table 190 are decoded and decompressed by Nomad, as indicated in a Table 192. The 15 bytes of compressed and encoded data are input to Nomad, which processes the encoded data byte by byte, producing output data. The processing of the encoded data follows the steps from FIGS. 6 and 7, as indicated in Table 192. The first byte that is processed is 31H, yielding nibble "1," and then byte 32H is processed, yielding the nibble "2." Thus, the output byte in the decoded data stream is 12H, consistent with FIG. 6, blocks 134 through 142. The next byte did not require encoding and is thus output without change, as provided by block 146 in FIG. 6. Similarly, byte 22H is output unchanged. Next, the occurrence of the RLE signal byte 7EH indicates that a repeating byte has been encoded. The byte 7EH is discarded, as provided in block 162 of FIG. 7. A byte 32H in the encoded data stream (the NumNibblesInLength value) indicates that two nibbles are used for the RepeatCount. These two nibbles, which were encoded to produce bytes 36H and 34H, yield the RepeatCount 64H, as indicated in FIG. 7, blocks 168, 170, 172, and 174. The encoded byte of data that was repeated 64H time is represented by bytes 33H and 35H. These two bytes are decoded to yield byte 35H, and this byte is repeated 100 times in the output data stream, as required by the decoded RepeatCount. Next, byte 45H is output without change, since it was among the recognized characters and did not need to be encoded. The bytes 37H and 3EH are decoded to yield the output byte 7EH, also consistent with FIG. 6, blocks 134 through 142. Similarly, bytes 37H and 3FH are decoded to recover the output byte 7FH. Accordingly, the output data from the decoding operation are identical to the input data that were encoded as described above, in connection with FIG. 8.

Personal Computer System Used to Transmit Page Objects

Figure 10:
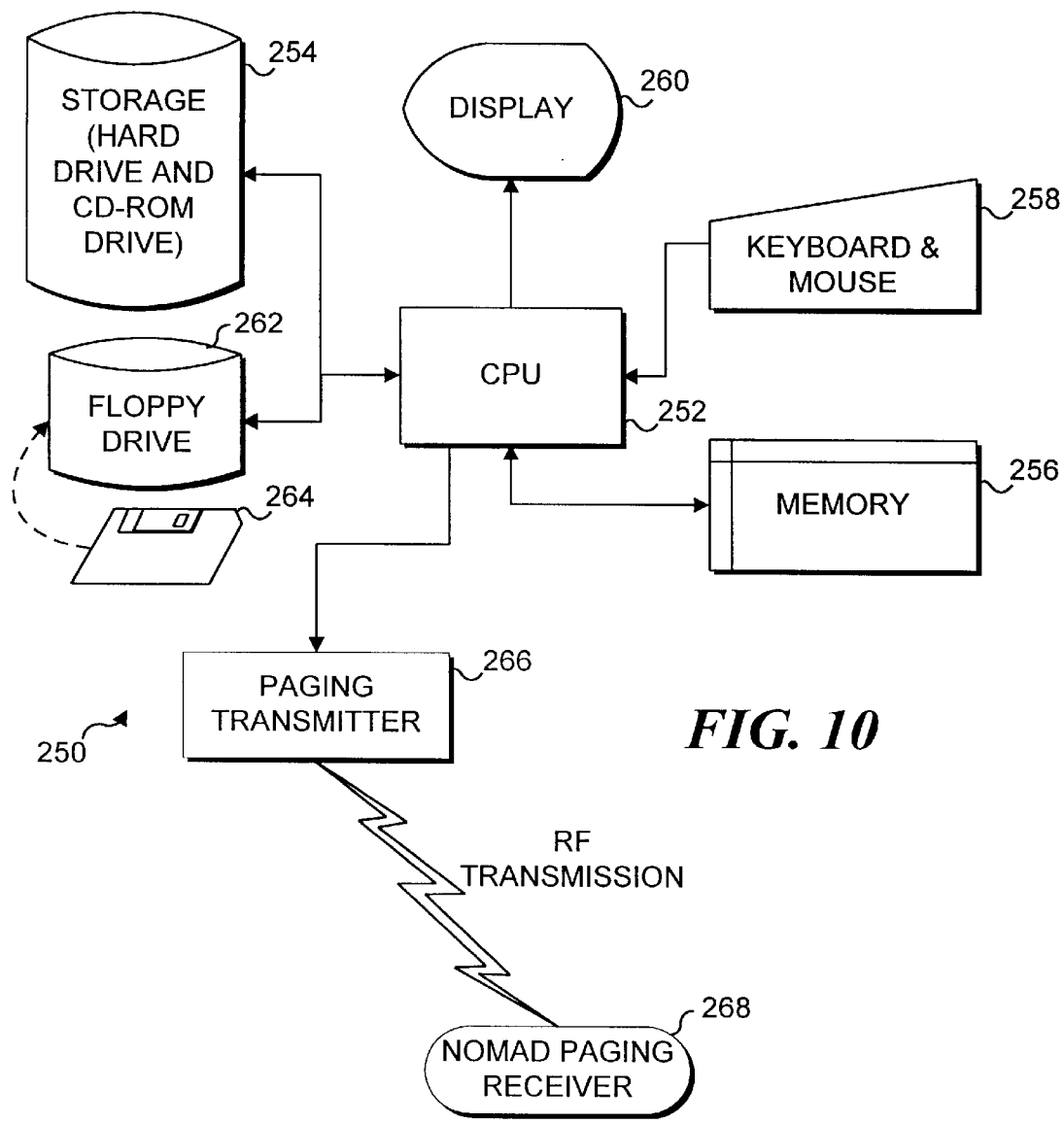
FIG. 10 is a block diagram showing components of a generally conventional personal computer that is used to encode the input data for transmission to the pager.

FIG. 10 illustrates components of a generally conventional personal computer system 250 that is used to transmit page objects to Nomad, which are encoded and compressed as described above. A CPU 252 is included to execute machine instructions that define each of the functions implemented by personal computer system 250, including the encoding and RLE compression functions of the present invention. Storage 254 provided for application programs and data accessed by CPU 252 includes a hard drive and optionally, a compact disk-read only memory (CD-ROM) drive (not separately shown). The non-volatile memory comprising storage 254 is coupled bidirectionally to CPU 252, as is a floppy drive 262. The floppy drive is provided to read and write programs and data to and from a floppy disk 264. It is likely that the software comprising machine instructions that define the paging and data encoding/ compression functions of the present invention will be distributed on such a floppy disk or on a CD-ROM for loading into the hard drive comprising storage 254. When the software defining these functions is to be run, the machine instructions comprising the software are loaded into a memory 256 that includes both ROM and RAM. Once loaded into RAM, the machine instructions are executed by CPU 252, causing the CPU to implement the encoding and RLE compression of the data to be transmitted.

Also included in personal computer system 250 is a display 260, which is coupled to CPU 252 (typically through a display interface card, which is not separately shown). The sender can use a keyboard and mouse 258 for composing paging messages and other types of page objects that are transmitted to Nomad. The CPU is coupled to a paging transmitter 266, which produces the RF transmission that conveys the page object to a Nomad pager 268. This depiction of the system used to transmit a page object is very much simplified, because the details of the paging transmission system are not essential in providing an enabling disclosure of the present invention. Thus, details of the relatively complex paging transmission system that is conventionally employed to ensure that a page object will reach the intended recipient at any point in an extended geographic area is not shown in FIG. 10.

Although the present invention has been described in connection with the preferred form of practicing it, those of ordinary skill in the art will understand that many modifications can be made thereto within the scope of the claims that follow. Accordingly, it is not intended that the scope of the invention in any way be limited by the above description, but instead be determined entirely by reference to the claims that follow.

The invention in which an exclusive right is claimed is defined by the following:

1. A method for encoding data comprising any character from a set of characters for transmission over a communication channel in which only a subset of the set of characters is permitted to be transmitted, where each character of the set of characters is represented by a number base-n value, comprising the steps of:
  (a) dividing the number base-n value representing each character of the data to be transmitted into a plurality of nibbles, where each nibble is a single number base-n digit;
  (b) selecting n encoding characters from the subset of the characters permitted to be transmitted, each of the encoding characters being assigned to represent a different number base-n digit;
  (c) creating encoded data by using one of the n encoding characters to represent each nibble of:
    (i) any character in the data to be transmitted that is not within the subset of the characters permitted to be transmitted; and
    (ii) any character in the data that is one of the n encoding characters; and
  (d) using each character of the data to be transmitted that is within the subset of the characters permitted to be transmitted, but is not one of the encoding characters, in the encoded data without change.

2. A method for encoding data comprising any character included in a set of characters, for transmission over a communication channel in which only a subset of the characters is permitted to be transmitted, where each character of the set of characters is represented by a hexadecimal value, comprising the steps of:
  (a) for each character in the data to be transmitted, obtaining a plurality of nibbles that comprise the hexadecimal value representing said character, each nibble being a single hexadecimal digit;
  (b) selecting a plurality of encoding characters from the subset of characters permitted to be transmitted, each of the plurality of encoding characters being assigned to encode a different hexadecimal digit; and
  (c) producing encoded data by replacing the plurality of nibbles representing each character in the data to be transmitted with the encoding characters assigned to encode the hexadecimal digits comprising the plurality of nibbles of said character if:
    (i) said character in the data to be transmitted is not in the subset of data; or
    (ii) is one of the encoding characters; else
  (d) using said character in the encoded data directly.

3. The method of claim 2, wherein the encoding characters selected from the subset of characters comprise sixteen contiguous characters.

4. The method of claim 2, wherein the encoding characters selected from the subset of characters comprise sixteen characters that are selected from the subset of characters as a function of a statistical attribute of said sixteen characters.

5. The method of claim 4, wherein the statistical attribute comprises a frequency of use of the sixteen characters in the data to be transmitted over the communication channel.

6. The method of claim 2, further comprising the step of compressing the data to be transmitted to produce compressed encoded data.

7. The method of claim 6, wherein the step of compressing comprises the step of run length encoding by determining a number of times that any character in the data to be transmitted is successively repeated.

8. The method of claim 7, wherein one of the characters from the subset of characters is selected as a compressed block signal indicator character to indicate where each block of the compressed data occurs within the compressed encoded data.

9. The method of claim 8, wherein said compressed block signal indicator character is also encoded by replacing a plurality of nibbles comprising its hexadecimal value with the encoding characters assigned to said nibbles.

10. The method of claim 2, wherein the step of producing the encoded data comprises the step of using a lookup table to encode the data to be transmitted, said lookup table including sixteen hexadecimal digits and the encoding character assigned to each of the sixteen hexadecimal digits.

11. A method for decoding encoded data transmitted over a communication channel in which only a subset of the characters comprising the data that was encoded is permitted to be transmitted, where the encoded data includes a plurality of number base-n values corresponding to encoding characters selected from the subset of characters, comprising the steps of:
  (a) if a number base-n value in the encoded data corresponds to one of the encoding characters, replacing said value with a number base-n digit to which the encoding character corresponds, a plurality of successive number base-n digits thus determined representing a character of the data that was encoded and being thus included in decoded data produced by the method; and
  (b) if a number base-n value in the encoded data corresponds to one of the characters from the subset of characters permitted to be transmitted, but is not one of the encoding characters, placing the character represented by said value from the subset of characters that is permitted to be transmitted in the decoded data.

12. A method for decoding encoded data transmitted over a communication channel in which only a subset of a set of characters comprising the data that was encoded is permitted to be transmitted, where each character of the set of characters is represented by a hexadecimal value, comprising the steps of:

(a) specifying a plurality of characters from the subset that were used as encoding characters to encode the data transmitted, each encoding character being assigned to encode a different nibble of a byte representing a character that was encoded, and each nibble comprising a hexadecimal digit;

(b) if any byte in the encoded data represents one of the encoding characters, replacing said byte with the nibble to which said one encoding character is assigned, each successive pair of nibbles thus determined comprising a byte that represents a character of the decoded data; and (c) if any byte appearing in the encoded data represents a character that is in the subset of characters permitted to be transmitted but is not one of the encoding characters, placing said character represented by said byte in the decoded data.

13. The method of claim 12, further comprising the step of run length decoding a portion of the encoded data to determine a repeated character and a number of times that the repeated character appears in succession within the decoded data.

14. The method of claim 13, wherein the step of run length decoding comprises the step of detecting blocks of run length encoded data by detecting a byte representing one character of the subset of characters permitted to be transmitted that was previously selected to indicate such blocks.

15. A system for encoding data comprising characters included in a set of characters, for transmission over a communication channel in which only a subset of the set of characters is permitted to be transmitted, where each character in the set of characters is represented by a hexadecimal value, comprising:

(a) a memory in which a plurality of machine instructions are stored, said machine instructions comprising a software program; and (b) a processor that is coupled to the memory and controlled by the machine instructions to implement a plurality of functions used for encoding the data for transmission over the communication channel, said plurality of functions including:
 (i) identifying a plurality of nibbles that comprise the hexadecimal value representing each character in the data to be transmitted, where each nibble is a single hexadecimal digit;
 (ii) selecting a plurality of encoding characters from the subset of characters permitted to be transmitted, each of the plurality of encoding characters being assigned to encode a different hexadecimal digit;
 (iii) producing encoded data by replacing each of the plurality of nibbles of the hexadecimal value representing a character in the data to be transmitted with the encoding characters assigned to encode the hexadecimal digits comprising the plurality of nibbles if said character:
  (A) is not in the subset of characters permitted to be transmitted; or
  (B) is one of the encoding characters; and otherwise
 (iv) including said character in the encoded data, without change.

16. The system of claim 15, wherein the encoding characters comprise sixteen contiguous characters.

17. The system of claim 15, wherein the encoding characters comprise sixteen characters that are selected from the subset of characters as a function of a statistical attribute of the encoding characters.

18. The system of claim 15, wherein the statistical attribute comprises a frequency of use of the characters in data transmitted over the communication channel.

19. The system of claim 15, wherein the functions implemented by the processor when executing the machine instructions further include compressing the data to be transmitted.

20. The system of claim 19, wherein run length encoding is implemented by the processor to compress the data to be transmitted, said run length encoding including determining a number of times that any character is repeated in succession within the data to be transmitted.

21. The system of claim 20, wherein one of the characters from the subset of characters is selected as a compressed block signal indicator character to indicate where a block of compressed data occurs.

22. The system of claim 21, wherein said compressed block signal indicator character is also encoded by replacing the plurality of nibbles that comprise its hexadecimal value with the encoding characters assigned to encode the nibbles.

23. The system of claim 15, wherein a lookup table stored in the memory is used to encode the data to be transmitted, said lookup table including sixteen hexadecimal digits and the encoding character assigned to encode each hexadecimal digit.

24. A system for decoding encoded data transmitted over a communication channel in which only a subset of the characters comprising the data that was encoded is permitted to be transmitted, where each character of the set of characters is represented by a hexadecimal value, comprising:

(a) a memory in which a plurality of machine instructions are stored, said machine instructions comprising a software program; and (b) a processor, coupled to the memory and controlled by the machine instructions to implement a plurality of functions used for decoding the encoded data, said functions including:
 (i) specifying a plurality of characters from the subset that were used as encoding characters to encode the data transmitted, each encoding character being assigned to encode a different nibble of a byte representing a character that was encoded, and each nibble comprising a hexadecimal digit;
 (ii) if any byte in the encoded data represents one of the encoding characters, replacing said byte with the nibble to which said one encoding character is assigned, each successive pair of nibbles thus determined comprising a byte that represents a character of the decoded data; and
 (iii) if any byte appearing in the encoded data represents a character that is in the subset of characters permitted to be transmitted but is not one of the encoding characters, placing said character represented by said byte in the decoded data.

25. The system of claim 24, wherein the machine instructions further cause the processor to run length decode said encoded data.

26. The system of claim 25, wherein the machine instructions further cause the processor to detect blocks of run length encoded data by detecting a run length encoding signal character in the encoded data, where said signal character is previously selected from the characters permitted to be transmitted, to identify such blocks of run length encoded data.

* * * * *